United States Patent [19]
Watanabe et al.

[11] Patent Number: 6,059,586
[45] Date of Patent: May 9, 2000

[54] MEMORY CARD CONNECTOR

[75] Inventors: Satoru Watanabe, Tokyo; Toshitaka Kusuhara, Yokohama, both of Japan

[73] Assignee: The Whitaker Corporation, Wilmington, Del.

[21] Appl. No.: 09/029,924

[22] PCT Filed: Sep. 5, 1996

[86] PCT No.: PCT/US96/14206

§ 371 Date: Mar. 11, 1998

§ 102(e) Date: Mar. 11, 1998

[87] PCT Pub. No.: WO97/10690

PCT Pub. Date: Mar. 20, 1997

[30] Foreign Application Priority Data

Sep. 12, 1995 [JP] Japan ................................ 7-234317

[51] Int. Cl.[7] .................................................. H01R 13/635
[52] U.S. Cl. ....................... 439/159; 439/159; 439/541.5; 439/64
[58] Field of Search ............................ 439/159, 541.5, 439/64, 630

[56] References Cited

U.S. PATENT DOCUMENTS

| | | |
|---|---|---|
| 5,277,615 | 1/1994 | Hastings et al. ........................ 439/477 |
| 5,286,207 | 2/1994 | McHugh .................................. 439/64 |
| 5,297,966 | 3/1994 | Brennian, Jr. et al. .................... 439/64 |
| 5,324,204 | 6/1994 | Lwee ....................................... 439/64 |
| 5,421,737 | 6/1995 | Chen et al. .............................. 439/157 |
| 5,443,395 | 8/1995 | Wang ...................................... 439/159 |
| 5,468,160 | 11/1995 | Broschard, III et al. ................ 439/567 |
| 5,490,791 | 2/1996 | Yamada et al. .......................... 439/159 |
| 5,591,047 | 1/1997 | Yamada et al. ........................ 439/541.5 |
| 5,643,001 | 7/1997 | Kaufman et al. ......................... 439/159 |
| 5,795,190 | 8/1998 | Ono ........................................ 439/607 |

FOREIGN PATENT DOCUMENTS

| | | |
|---|---|---|
| 0473418 A2 | 4/1992 | European Pat. Off. ......... H05K 7/14 |
| 2310610 | 9/1974 | Germany . |

*Primary Examiner*—Paula Bradley
*Assistant Examiner*—Truc Nguyen

[57] ABSTRACT

A memory card connector comprises stacked frames (60, 80) having mounting brackets (68a–68d, 80a–80d; 70a, 70b; 90a, 90b) extending out from side walls (64, 84; 66, 86) of the frames, and mounting fixtures having openings (126a–128d, 128a–128d; 166a, 166b; 168a, 168b) for receiving the mounting brackets to fix the frames (60, 80) together and mount the frames to a base.

14 Claims, 7 Drawing Sheets

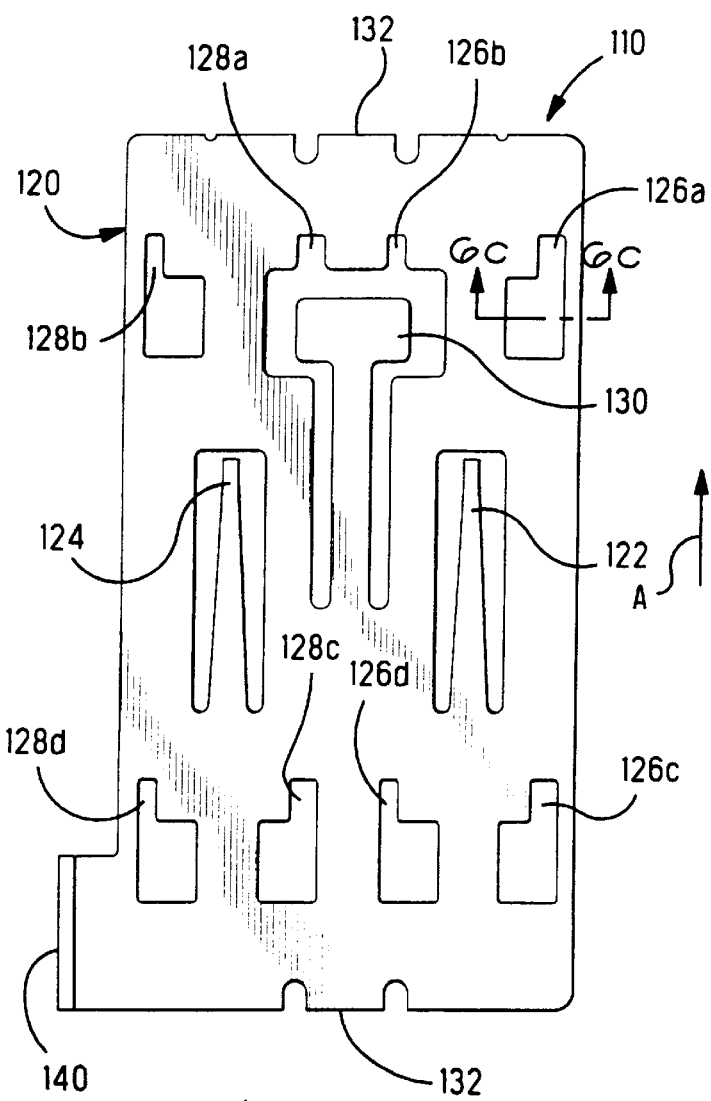
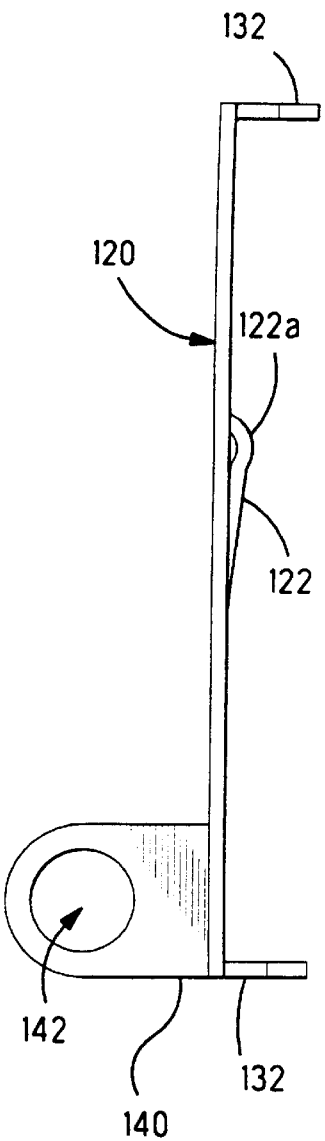
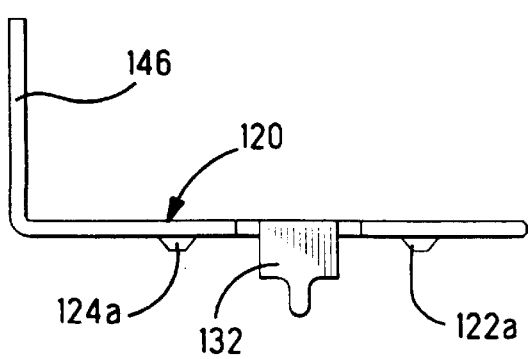
Fig.5a
Fig.5b
Fig.5c

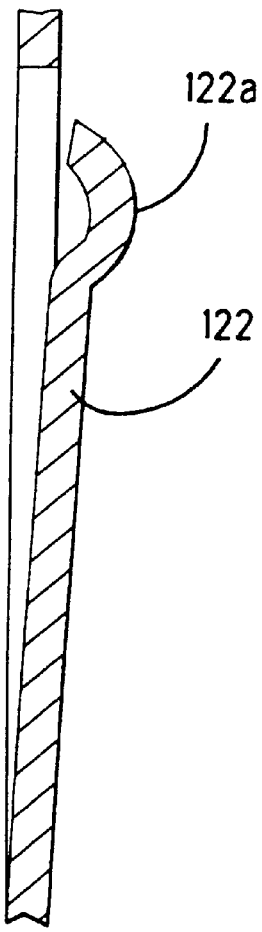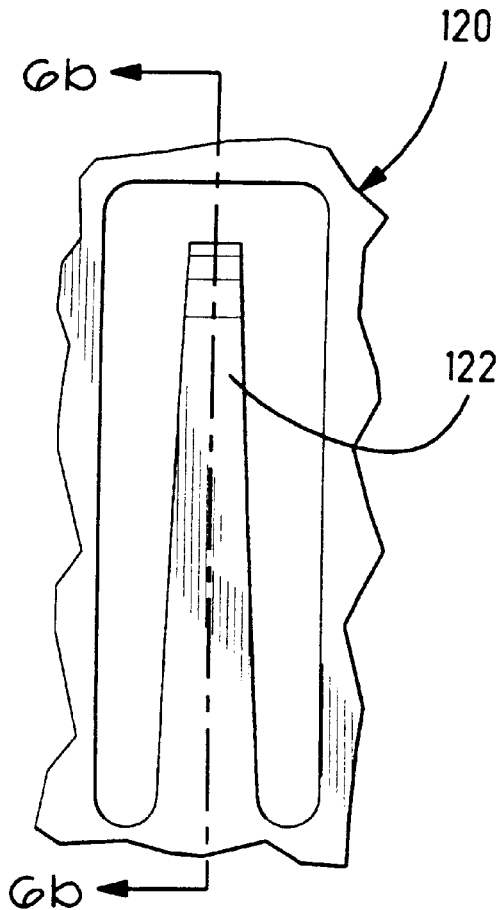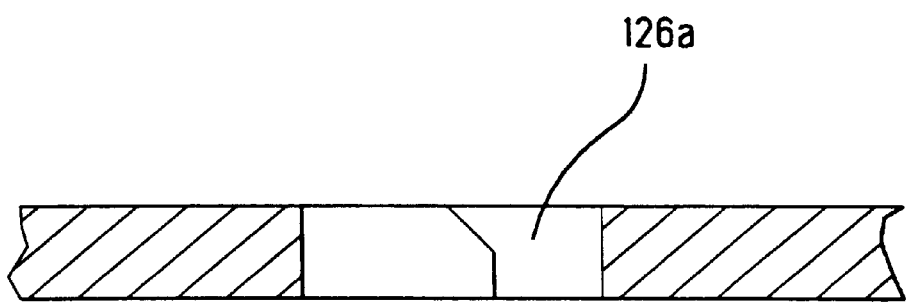
Fig.6b
Fig.6a
Fig.6c

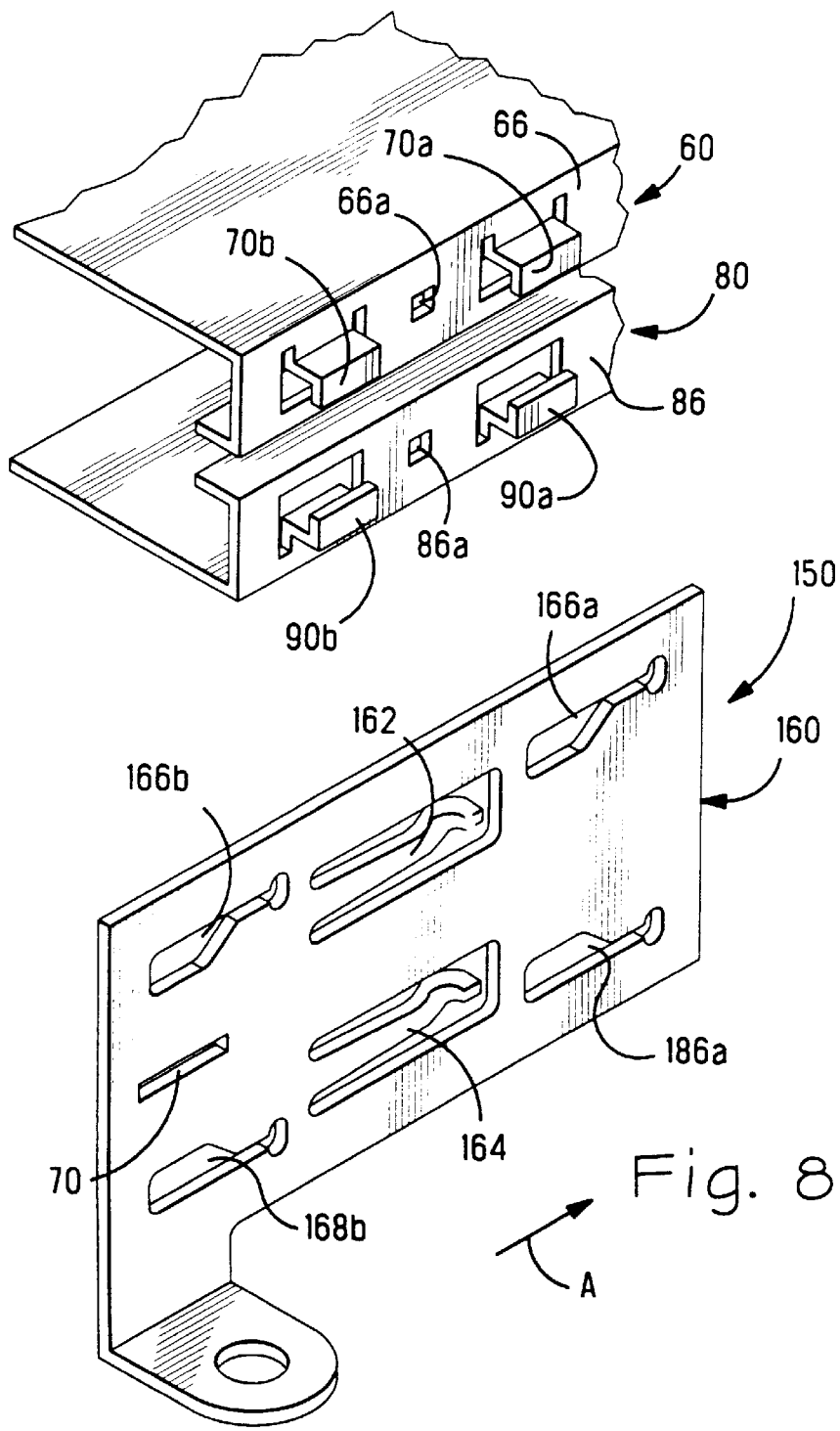
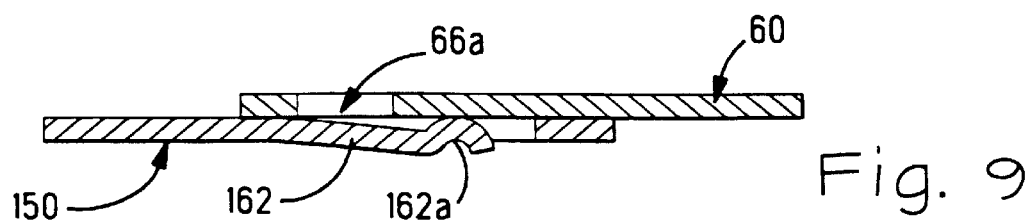

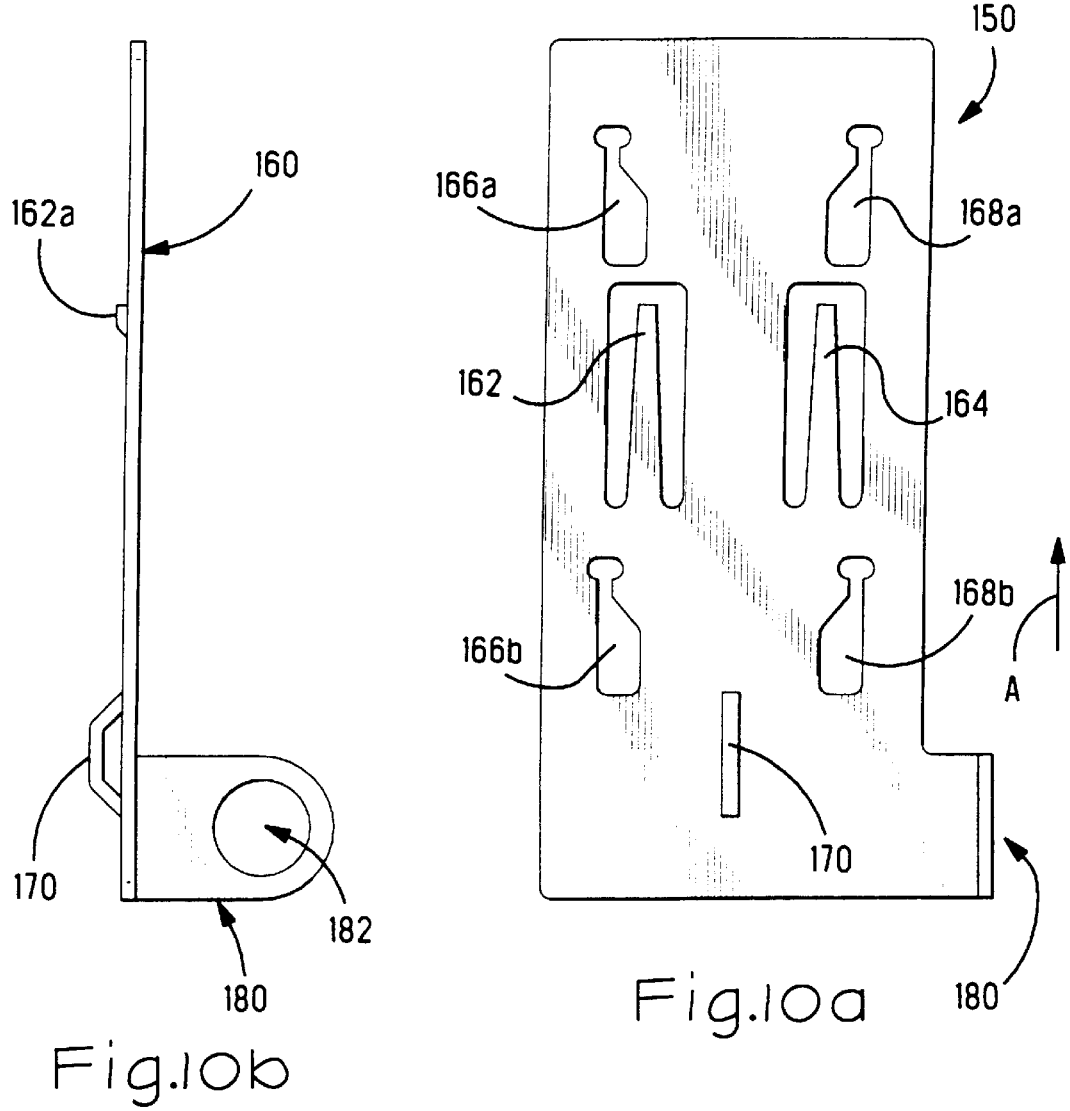
Fig.10b
Fig.10a
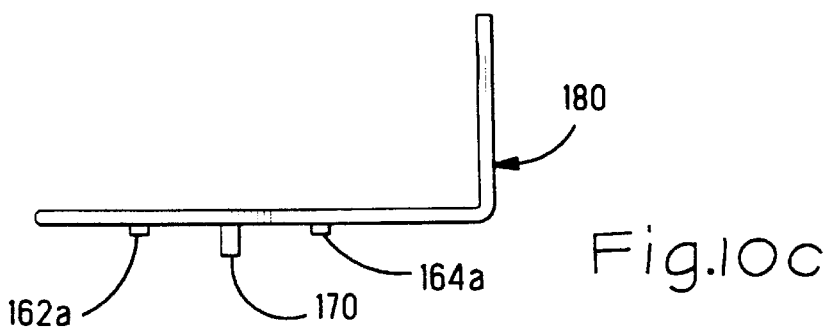
Fig.10c

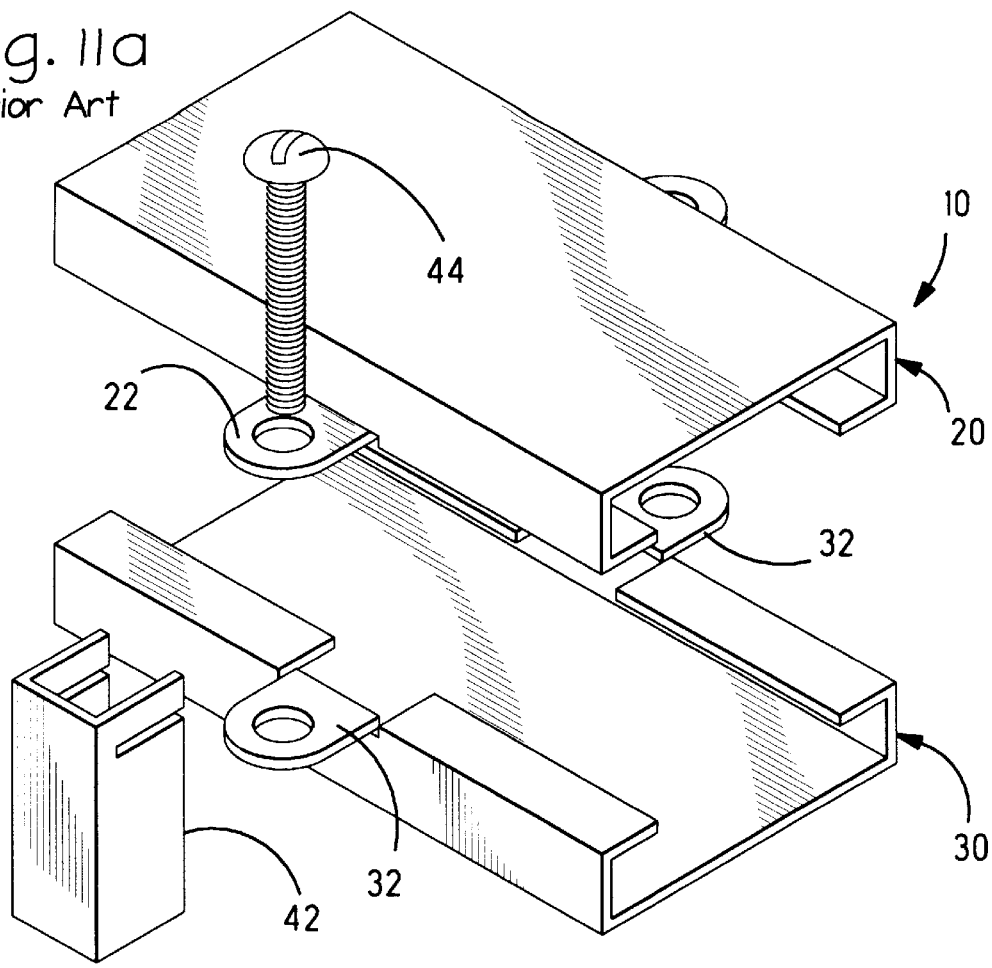
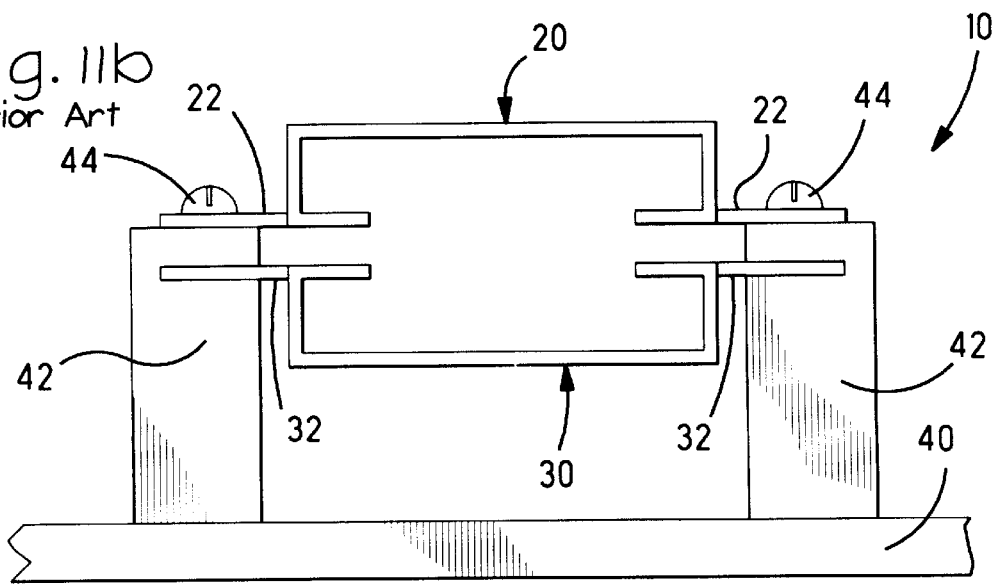

MEMORY CARD CONNECTOR

FIELD OF THE INVENTION

This invention relates to a memory card connector for receiving a memory card therein and electrical connection with circuit boards.

BACKGROUND OF THE INVENTION

Printed circuit cards incorporating integrated circuits are widely used in personal computers and similar devices and are known as memory cards. Printed circuit cards are used by inserting them in slots of special connectors equipped with frames in which the cards are inserted. Memory card connectors are usually equipped with an actuating member sliding in the direction of card insertion and a card-ejection member ejecting the card inserted in the frame in response to the motion of the actuating member in the direction of insertion.

An example of such memory card connectors equipped with a card-ejection member and an actuating member is shown in FIG. 11. This example represents a two-level memory card connector comprising two frames mounted in a multilayer configuration.

This two-level memory card connector 10 includes two frames 20 and 30 for the insertion of individual memory cards (not shown) which are mounted one upon another; both frames 20 and 30 have mounting flanges 22 and 32. The two frames 20 and 30 are fixed to the base 40 by inserting flanges 32 in tubular mounting fixtures 42 and by securing them by means of bolts 44 passed through aligned flanges 22 and 32. When frames 20, 30 are fixed to the base using fixtures 42, it is necessary to allocate certain space on the base for the fixtures 42, and the disadvantage of this is that the base space for fixtures 42 is large and cannot be effectively used.

In addition to the method of securing two frames placed on top of each other for a two-level memory card connector described above, it is possible to use brackets which fit in slots of L-shaped fixtures having bolt holes. This method calls for the assembly of a memory card connector by using two frames which are mounted by inserting the connecting sections of the brackets in the slots and by fastening the structure to the base by bolts passed through the bolt holes. Advantage of this method is that it allows for a more effective use of space compared to the method in which tubular fixtures 42 are used.

However, if there is a need to change the location of a memory card connector mounted to the base by the above method using L-shaped fixtures, it is also necessary to change position of the brackets on the frame. In such a case, extensive changes are required in the frame design leading to a substantial cost increase. In addition, since two frames are secured by inserting the connecting sections of the brackets in the slots in the L-shaped fixtures, the removal of the connecting sections of the brackets from the slots may cause damage to the connecting sections so that it will be impossible to install these two frames again.

SUMMARY OF THE INVENTION

Considering the above mentioned circumstances, the purpose of this invention is to provide a memory card connector equipped with fixtures making it possible to reliably secure two frames which would provide the possibility of an easy change of the location of the memory card connector secured on the base.

In order to achieve the purposes stated above, a memory card connector according to this invention comprises frames intended for the insertion of memory cards from the direction of insertion which are to be mounted to a base and they have several brackets spaced from each other at a predetermined distance in the direction of the insertion with at least one of these brackets extending outside a side wall and side walls facing each other on the left and the right sides of the frames; an actuating member extending in the direction of insertion which is attached to the outside of one of the side walls and which can slide in the direction of card insertion; an ejection member for ejecting the inserted card when the actuating member is pushed in the direction of insertion; and a mounting fixture guiding the actuating member which is located between the mounting fixture and the side wall which has a plate-shaped guiding section attached to the side wall by means of the several brackets and a mounting foot of the mounting fixture whose purpose is to mount the frames to the base.

A memory card connector comprises a frame having a card-receiving area for receiving a memory card therein, an actuating member slidably mounted along one side wall of the frame, a card-ejection member pivotally mounted onto the frame at an inner end thereof and having one end connected to an inner end of the actuating member and a free end for engagement with the memory card to eject the memory card from the frame upon pivotal movement of the card-ejection member by the actuating member, and a mounting fixture for attachment to the frame and mounting the frame to a base, wherein the frame has brackets extending out from a side wall thereof, the mounting fixture has openings in which the brackets are disposed, spring members engage the frame thereby maintaining the mounting fixture on the frame, and a mounting foot on the mounting-fixture for mounting the frame to a base.

Embodiments of the invention will now be described by way of example with reference to the accompanying drawings.

BRIEF DESCRIPTION OF THE DRAWINGS

FIGS. 5a, 5b and 5c are side, top plan and front views, respectively, of the mounting fixture of FIG. 3.

FIG. 6a shows a portion of the mounting fixture shown in FIG. 5.

FIG. 6b is a cross-sectional view taken along line 6b—6b of FIG. 6a.

FIG. 6c is a cross-sectional view taken along line 6c—6c of FIG. 5a.

FIG. 7 is a part perspective view of the memory card frames showing mounting brackets of right walls thereof.

FIG. 8 is a perspective view of an alternative-mounting fixture.

FIG. 9 is a part cross-sectional view showing the mounting fixture of FIG. 8 connected to one of the right walls shown in FIG. 7.

FIGS. 10a, 10b and 10c are side, top plan and front views, respectively, of the mounting fixture of FIG. 8.

FIGS. 11a and 11b are perspective and front views, respectively, of a conventional memory card connector.

DETAILED DESCRIPTION OF AN EMBODIMENT OF THE INVENTION

Figure 2:
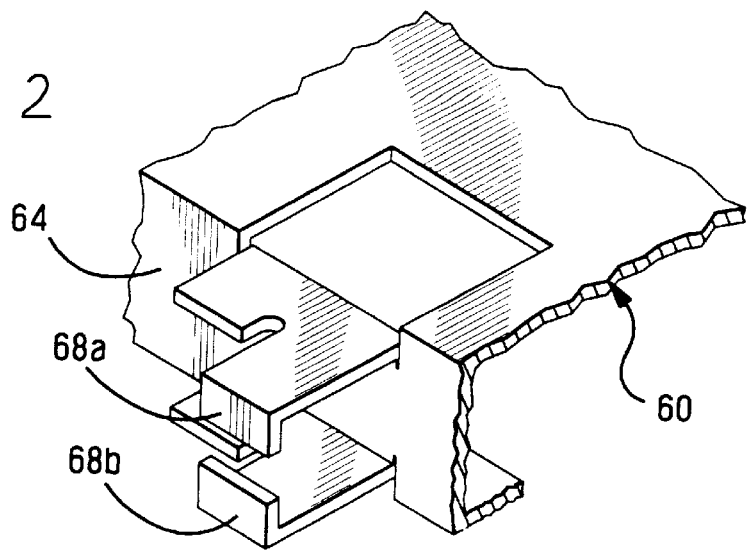
FIG. 2 is a part perspective view of one of the memory card frames showing mounting brackets of a left wall thereof.
Figure 3:
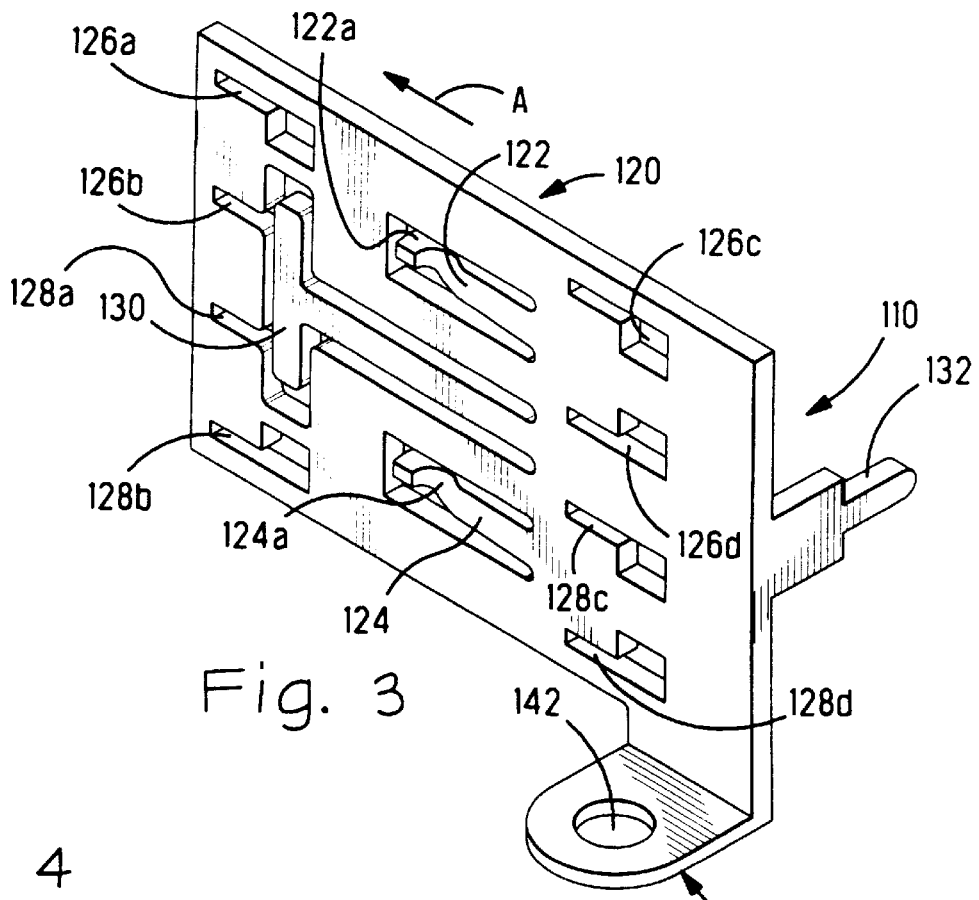
FIG. 3 is a perspective view of a mounting fixture.

A two-level memory card connector 50 is made by stacking metal frames 60, 80 with electrical connectors 52 (left and right sides are not shown in the drawing). Frames 60, 80 are stamped out from a thin metal sheet material. Left and right edges of frames 60, 80 are bent and guides 62, 82 supporting printed circuit memory cards 54 inserted in or ejected from the connector in the direction of insertion (shown by arrow A) are formed. Frames 60 and 80 are facing each other and their left walls 64, 84 and right walls 66, 86 extend in the direction of insertion, and several brackets 68a, 68b, 68c, 68d located at a certain distance from each other in the direction of insertion and protruding outside from the left wall 64 are formed by bending metal sheet material of the frame 60 (see FIG. 2). Brackets 68a, 68b and brackets 68c, 68d are grouped in pairs and spaced from each other in the direction of insertion. Another set of brackets 88a, 88b, 88c, 88d, similar to those made from left wall 64, are made from left wall 84. They are made by bending metal sheet material of frame 80 and protrude outside in the same manner as left wall 64. Right walls 66, 86 also have brackets 70a, 70b, 90a, 90b protruding outside made from metal sheet material of frames 60, 80 (see FIG. 7). Brackets 70a, 70b, 90a, 90b are also located at a distance from each other in the direction of insertion. The purpose of these brackets will be explained below. In addition, on the left walls 64, 84, claws 72 (not shown in the plan projection) are made from metal sheet material of frames 60, 80 whose purpose is to retain an actuating member 100 (actuating member secured to the left wall 84 is not shown in the drawing). An explanation concerning the actuating member 100 will be given below.

Figure 1B:
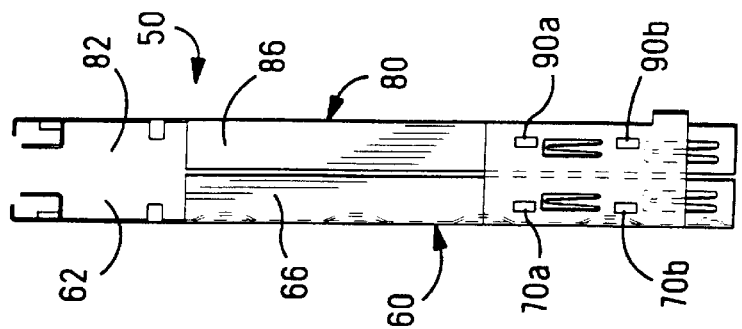
FIGS. 1a, 1b and 1c are top plan, right side and left side views, respectively, of a memory card connector according to the present invention.
Figure 1A:
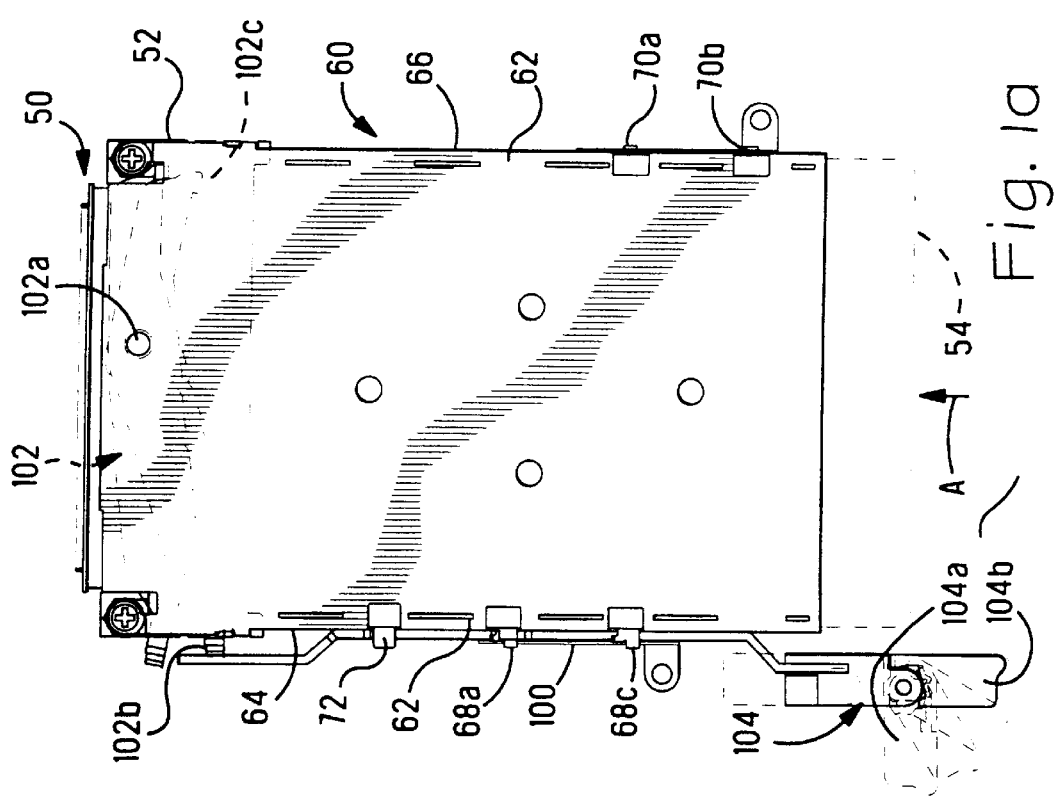
Figure 1C:
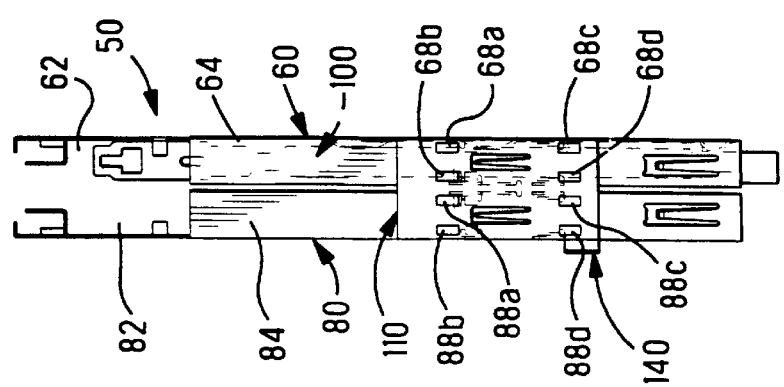

Actuating member 100 and ejection member 102 (not shown in the side views; the ejection member is not shown on frame 80) are secured on frames 60, 80 for the purpose of the ejection of printed circuit memory cards 54. Actuating member 100 is fabricated by stamping from metal sheet material. As depicted in FIG. 1a the actuating member 100 is retained by claws 72 so that it can reciprocably slide along the side wall. The front end, when looking in the direction of insertion of the memory card, is connected to one end 102b of the ejection member 102. The middle section 102a of the ejection member 102 is connected by an axis to the frame 60. The free end 102c of ejection member 102 engages the memory card to eject it from the memory card connector when the ejection member 102 is operated by actuating member 100. An operating button 104 is secured on the rear end of the actuating member 100 when looking in the direction of insertion. In order to eject a memory card 54 inserted in the frame 60, the operator has to push the button 104 in the direction of insertion. The operating button 104 comprises a stationary section 104a and a pivoted section 104b which upon a force applied to the actuating member 100 in the direction of insertion pivots away from the frame 60 (see FIG. 1) from a first position to a second position (shown by broken lines). The pivotal section 104b is moved to the second position when a memory card 54 is inserted in the frame 60. This serves as an indicator that the card connector 50 is in use and helps prevent erroneous operation of the actuating member.

Below, an explanation concerning a mounting fixture secured on left walls 64, 84 of the frames 60, 80 using FIGS. 2 through 6 for reference will be given.

Mounting fixture 110 has a flat guiding section 120 for the actuating member 100 (see FIG. 1) which slides between the guiding section 120 and left walls 64, 84 (see FIG. 1), and a mounting foot 140 used for the mounting of frames 60, 80 to the base in the form of a circuit board (not shown in the drawing).

The guiding section 120 has spring tongues or members 122, 124 intended to press the actuating members 100 against the left walls 64, 84. At the tips of the tongues 122, 124, small bosses 122a, 124a (124a is not shown in the drawing) are provided which face left walls 64, 84. These bosses 122a, 124a engage against the actuating members 100 and press them against the left walls 64, 84. Guiding section 120 has stepped openings 126a, 126b, 126c, 126d into which brackets 68a, 68b, 68c, 68d of the left wall 64 are inserted. Brackets 88a, 88b, 88c, 88c (see FIG. 1c) of the left wall 84 fit into stepped openings 128a, 128b, 128c, 128d. For a better retention of brackets 68b, 88a in the openings 126b, 128a of the guiding section 120 respectively, a T-shaped resilient or spring member 130 is provided. In order to separate frame 60 from frame 80 to a predetermined distance, protrusions 132 are located on the guiding section 120, one each at the front and the back edges when looking in the direction of insertion.

Mounting foot 140 has a through hole 142 for a bolt (not shown in the drawing) which is used for securing frames 60, 80 to a base (not shown in the drawing) by passing the bolt through the hole 142 and securing the mounting fixture 110 to the base.

Figure 4:
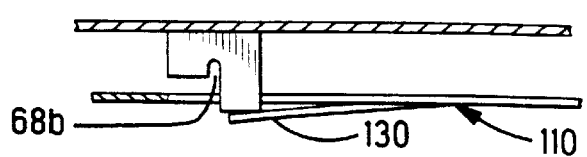
FIG. 4 is a part cross-sectional view showing a mounting bracket of the left wall of FIG. 2 connected to the mounting fixture.

In order to attach the mounting fixture 110 to frames 60, 80, first brackets 68a, 68c, 68d, 88b, 88c, 88d are fitted in the wide portion of the respective stepped openings 126a, 126c, 126d, 128b, 128c, 128d. In this position, as shown in FIG. 4, brackets 68b, 88a lift spring tongue 130, and brackets 68b, 88a are not inserted in the openings 126b, 128a. If in such a position the mounting fixture 110 is pushed in the direction opposite to that of insertion (shown by arrow A), brackets 68a, 68c, 68d, 88b, 88c, 88d will slip in the narrow portion of the respective openings 126a, 126c, 126d, 128b, 128c, 128d, and at the same time, the spring tongue 130 is released from brackets 68b, 88a, after which brackets 68b, 88a are inserted in the openings 126b, 128a. This secures brackets 68b, 88a in the openings 126b, 128a, thus retaining the mounting fixture 110 attached to the left walls 64, 84 of frames 60, 80.

When the mounting fixture 110 becomes securely attached to the left walls 64, 84 by means of multiple brackets of the left walls 64, 84, it not only becomes strongly attached to the left walls 64, 84, but it also reliably secures two frames 60, 80 together. In addition, the fixture 110 also plays the role of a guide for the actuating members 100 and by means of spring tongues 122, 124 it prevents the actuating members 100 from being loosely mounted along walls 64, 84. Using the mounting foot 140 of the mounting fixture 110, frames 60, 80 are secured on a base. If it is required to change location on the base, it can be easily done by changing the position of the mounting foot 140 of the mounting fixture 110 which does not require much space on the base.

Next, the mounting fixture attached to the right side walls 66, 86 of the frames 60, 80 with reference to FIGS. 7 through 10c will be explained.

The mounting fixture 150 comprises a primary attachment section 160 which is a flat unit secured to frames 60, 80, and a secondary attachment section 180 in the form of a mounting foot by which frames 60, 80 are secured on the base (not shown in the drawing).

The primary attachment section 160 has spring tongues or members 162, 164 with bosses 162a, 164a at their tips which fit in the openings 66a, 86a of the right walls 66, 86. Bosses 162a, 164a of the spring tongues 162, 164 face the right walls 66, 86, and when the mounting fixture 150 is attached to the right walls 66, 86, they fit in the openings 66a, 86a, thus making it difficult to move the fixture 150 in the direction of insertion (shown by arrow A). In the primary attachment section 160, stepped openings 166a and 166b are made for the brackets 70a, 70b of the right wall 66, and stepped openings 168a, 168b for the brackets 90a, 90b of the right wall 86. In order to separate frame 60 from frame 80 to a predetermined distance, an inwardly-directed protrusion 170 is located in the primary attachment section 160 at its back edge when looking in the direction of insertion (shown by arrow A).

The secondary attachment section or mounting foot 180 has hole 182 for a bolt (not shown in the drawing) by which frames 60, 80 are secured on the base (not shown in the drawing). By passing the bolt through the hole 182, the mounting fixture 150 is attached to the base.

In order to attach the mounting fixture 150 to frames 60, 80, first brackets 70a, 70b, 90a, 90b are fitted in the wide portion of the respective stepped openings 166a, 166b, 168a, 168b. In this position, as shown in FIG. 9, spring tongues 162, 164 are pressed against the right walls 66, 86 of frames 60, 80, and the bosses 162a, 164a of the spring tongues 162, 164 are not inserted in the openings 66a, 86a. If in such a position the mounting fixture 150 is pushed in the direction opposite to that of insertion (shown by arrow A), brackets 70a, 70b, 90a, 90b will slip in the narrow portion of the respective stepped openings 166a, 166b, 168a, 168b and at the same time, the bosses 162a, 164a of the spring tongues 162, 164 enter the openings 66a, 86a. This makes it difficult to move the fixture 150 in the direction of insertion, and secures the mounting fixture 150 on the walls 66, 86.

By attaching the mounting fixture 150 to the right side walls 66, 86 frames 60, 80 are connected together. In addition, the secondary attachment section 180 of the mounting fixture 150 makes it possible to secure frames 60, 80 to the base. If it is required to change the location on the base, all necessary changes can be easily made by changing the location of the secondary attachment section 180.

As can be discerned from the above explanation, the memory card connector according to the invention can be used for the mounting of frames to a base by means of mounting fixtures that have a narrow profile and a small overall dimension. It is also easy to change the mounting location by changing the location of the mounting fixtures without changing the configuration of the frames. If the mounting fixture is used for a two-level memory card connector, a reliable mounting fixture for the upper and lower frames can be realized. The mounting fixture can also be used as a guide for an actuating member.

We claim:

1. A memory card connector comprising:

at least one frame having opposed side walls defining a card-receiving area for receiving a memory card therein, and brackets extending outwardly from at least one of said side walls; and at least one mounting fixture for attachment to the frame and mounting the frame to a base, said mounting fixture having a width larger than the width of side walls of said frame, and at least two groups of openings, said brackets of said at least one frame being disposed in a first group of openings and spring members of said mounting fixture engage the frame thereby maintaining the mounting fixture on the frame, said mounting fixture further including a mounting foot for mounting the frame to a base, whereby an other frame may be positioned against said at least one frame, said other frame including other brackets adapted to be disposed in a second group of openings in said mounting fixture, thereby defining stacked frames.

2. The memory card connector of claim 1 including at least two mounting fixtures and wherein each of said side walls includes brackets extending outwardly therefrom, said brackets of each said side wall being disposed in respective first groups of associated mounting fixtures.

3. The memory card connector of claim 1 further including an actuating member slideably mounted along one side wall of the frame; and a card-ejection member pivotally mounted onto the frame at an inner end thereof and having one end connected to an inner end of the actuating member and a free end for engagement with the memory card to eject the memory card from the frame upon pivotal movement of the card-ejection member by the actuating member.

4. A memory card connector as claimed in claim 3, wherein said actuating member is disposed between the side wall and a guiding section of the mounting fixture, and a spring tongue in said guiding section engages the actuating member thereby maintaining the actuating member against the side wall.

5. A memory card connector as claimed in claim 1, wherein the side wall has an opening, the spring member has a boss for disposition in said opening.

6. A memory card connector as claimed in claim 1, wherein said openings are stepped.

7. A memory card connector as claimed in claim 1, wherein another frame is positioned against said frame, said another frame includes other brackets extending out from side walls thereof, the other brackets being disposed in a second group of openings in the mounting fixture thereby defining stacked frames.

8. A memory card connector as claimed in claim 7, wherein the mounting fixture includes protrusions disposed between said frames.

9. A memory card connector comprising at least one frame having a card-receiving area for receiving a memory card therein, an actuating member slideably mounted along one side wall of the frame, a card-ejection member pivotally mounted onto the frame at an inner end thereof and having one end connected to an inner end of the actuating member and a free end for engagement with the memory card to eject the memory card from the frame upon pivotal movement of the card-ejection member by the actuating member, and a mounting fixture for attachment to the frame and mounting the frame to a base, characterized in that:

said at least one frame has brackets extending out from a side wall thereof, said mounting-fixture has a width larger than the width of side walls of said frame, and at least two groups of openings, said brackets of said at least one frame being disposed in a first group of openings and spring members of mounting fixture engage the frame thereby maintaining the mounting fixture on the frame, said mounting fixture further including a mounting foot for mounting the frame to a base.

10. A memory card connector as claimed in claim 9, wherein said actuating member is disposed between the side wall and a guiding section of the mounting fixture, and a spring tongue in said guiding section engages the actuating member thereby maintaining the actuating member against the side wall.

11. A memory card connector as claimed in claim 9, wherein the side wall has an opening, the spring member has a boss for disposition in said opening.

12. A memory card connector as claimed in claim 9, wherein said openings are stepped.

13. A memory card connector as claimed in claim 9, wherein another frame is positioned against said frame defining stacked frames, said another frame includes other brackets extending out from side walls thereof, the other brackets being disposed in a second group of openings in the mounting fixture.

14. A memory card connector as claimed in claim 13, wherein the mounting fixture includes protrusions disposed between said frames.

\* \* \* \* \*